United States Patent
Tanabe (10) Patent No.: US 7,199,606 B2
(45) Date of Patent: Apr. 3, 2007

(54) CURRENT LIMITER OF OUTPUT TRANSISTOR

(75) Inventor: Tsuyoshi Tanabe, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 58 days.

(21) Appl. No.: 11/024,598

(22) Filed: Dec. 30, 2004

(65) Prior Publication Data

US 2005/0162189 A1 Jul. 28, 2005

(30) Foreign Application Priority Data

Jan. 27, 2004 (JP) ............................ 2004-018078

(51) Int. Cl.
*H03K 19/003* (2006.01)

(52) U.S. Cl. ............................ 326/33; 326/32; 326/34

(58) Field of Classification Search ............ 326/31–34, 326/82–83; 323/316, 276, 277, 280; 361/18, 361/93.1, 93.9
See application file for complete search history.

(56) References Cited

U.S. PATENT DOCUMENTS 5,272,392 A 12/1993 Wong et al.
5,650,737 A * 7/1997 Eilley .......................... 327/108
6,664,773 B1 * 12/2003 Cunnac et al. .............. 323/277

FOREIGN PATENT DOCUMENTS

| CN | 1081841 C | 3/2002 |
|---|---|---|
| JP | 2-226808 | 9/1990 |
| JP | 2-226808 A | 9/1990 |
| JP | 02226808 A | 9/1990 |
| JP | 5-003289 | 1/1993 |
| JP | 6-113443 | 4/1994 |
| WO | WO 96/12347 | 4/1996 |

OTHER PUBLICATIONS

Chinese Office Action dated Aug. 18, 2006 (with English translation).
German Office Action dated Feb. 13, 2006 with English translation.

* cited by examiner

*Primary Examiner*—Anh Q. Tran
(74) *Attorney, Agent, or Firm*—McGinn IP Law Group, PLLC (57) ABSTRACT

A current limiter of an output transistor comprises an output transistor, a current detection transistor monitoring a current flowing through the output transistor, a current mirror circuit, a protection transistor outputting a current having passed through the current mirror circuit, the current being proportional to the monitored current and dependent on a voltage between a drain and a source or between a collector and an emitter of the output transistor and an input terminal connected to an output of the protection transistor.

13 Claims, 7 Drawing Sheets

FIRST POWER SUPPLY
− OUTPUT TERMINAL VOLTAGE

RELATED ART

Fig. 7

RELATED ART

Fig. 8

RELATED ART

Fig. 9

RELATED ART

CURRENT LIMITER OF OUTPUT TRANSISTOR

BACKGROUND OF THE INVENTION

1. Field of the Invention

The present invention relates to power semiconductor devices and particularly to a device having a current limiter of an output transistor.

2. Description of the Related Art

A power semiconductor device includes an input circuit, an output metal oxide semiconductor (MOS) transistor, an output MOS transistor control circuit, and so on. The power output MOS transistor heats up if a high current flows and energy increases. Thus, overcurrent causes thermal destruction of the output MOS transistor.

To avoid the thermal breakdown, some output MOS transistor control circuits have a current limiter. The current limiter monitors the current of the output MOS transistor and controls the gate voltage to limit an output current. The current limiter thereby prevents the self-destruction of the output MOS transistor due to high energy.

Since a higher drain-source voltage causes a higher energy in the output MOS transistor, it is necessary to reduce a current limit value as the drain-source voltage increases. Thus, development of a current limiter that allows the current control proportional to the drain-source voltage has been required.

Figure 6:
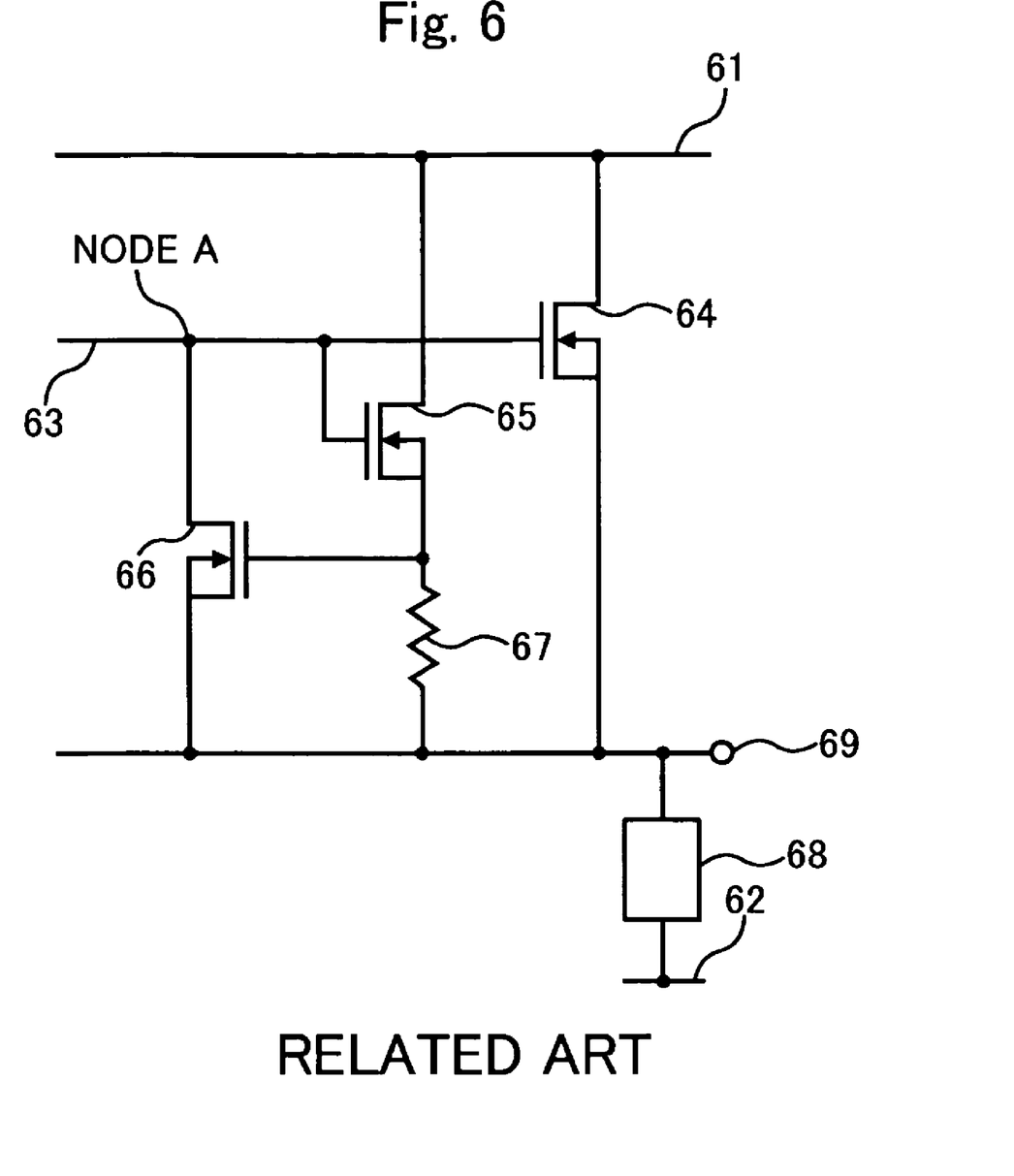
FIG. 6 is a circuit diagram of a current limiter according to a related art.
Figure 7:
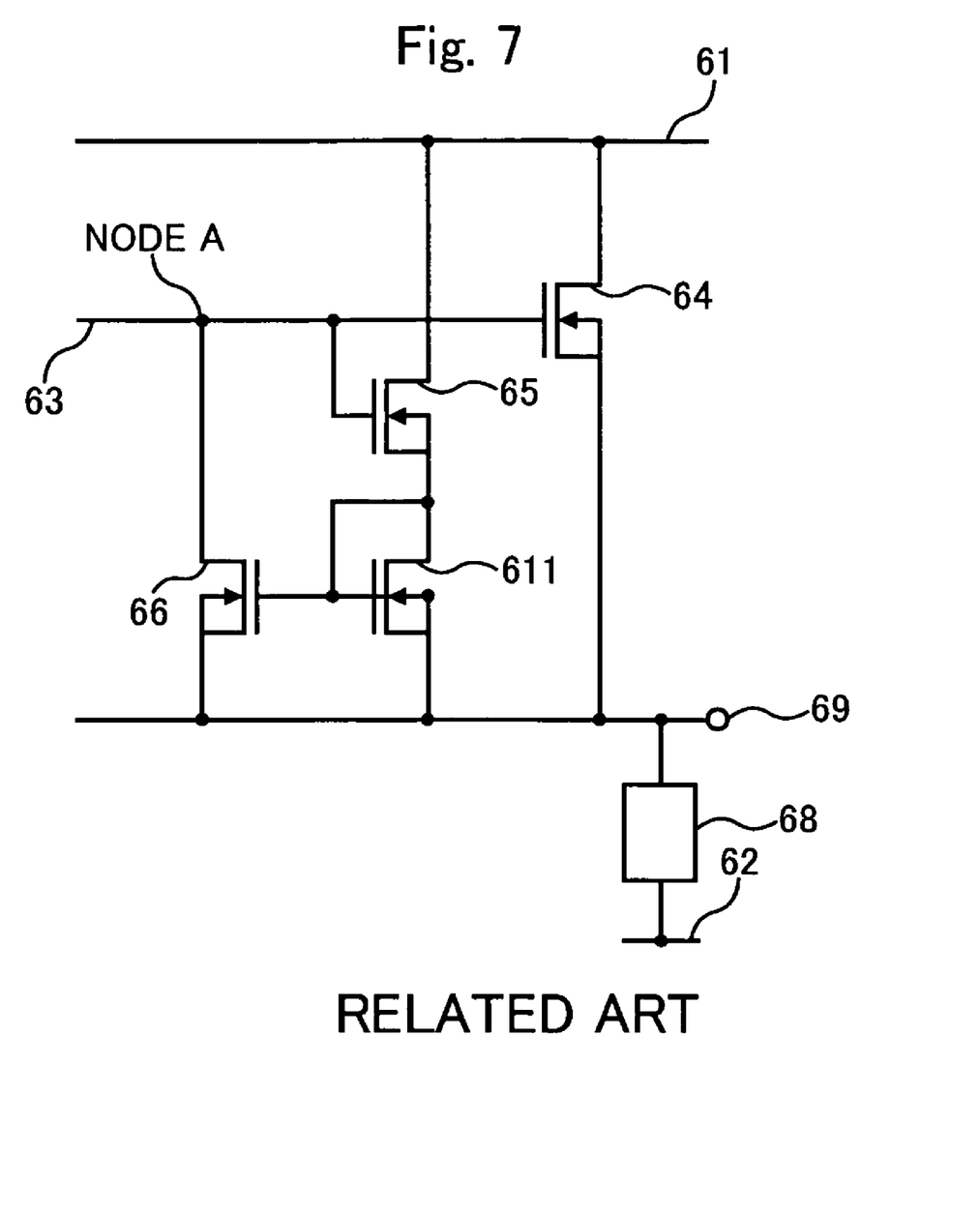
FIG. 7 is a circuit diagram of a current limiter according to another related art.

FIGS. 6 and 7 illustrate examples of current limiters. In FIG. 7, the same reference symbols as in FIG. 6 designate the same elements, and redundant explanation is omitted. The current limiter includes an Nch source follower in which an output MOS transistor 64 and a load 68 are connected in series between a first power supply 61 and a second power supply 62. An output terminal 69 is connected to a connection node of the output MOS transistor 64 and the load 68. The output MOS transistor 64 is turned on or off according to a control signal 63 inputted to its gate terminal.

The current limiter also has a current detection MOS transistor 65. A given ratio exists between the current detection MOS transistor 65 and the output MOS transistor 64. With this current ratio, the current detection MOS transistor 65 monitors the current of the output MOS transistor 64. A control resistor 67 or a control MOS transistor 611 whose drain and gate are short-circuited is connected between the source of the current detection MOS transistor 65 and the output terminal 69.

A protection MOS transistor 66 is connected between the node A and the output terminal 69. The gate of the protection MOS transistor 66 is connected to the source of the current detection MOS transistor 65.

The circuit operation is explained below. The operation when the output MOS transistor 64 is on is as follows. The control signal 63 is set higher than the first power supply voltage by a booster so as to reduce the on-resistance of the output MOS transistor 64. If the voltage of the node A is higher than the voltage of the first power supply 61 and the drain-source voltage of the output MOS transistor 64 is high, the drain current of the output MOS transistor 64 increases. At this time, a current proportional to the drain current flows into the current detection MOS transistor 65. Thus, the voltage of the control resistor 67 or the drain-source voltage of the control MOS transistor 611 is the gate voltage of the protection MOS transistor 66. The current thereby flows through the protection MOS transistor 66 to reduce the voltage at the gate of the output MOS transistor 64 or at the node A. Since the voltage of the node A decreases, the current of the output MOS transistor 64 decreases accordingly. In this way, the circuits of FIGS. 6 and 7 operate as a current limiter. Japanese Unexamined Patent Publication No. 02-226808 discloses this kind of technique.

If the drain-source voltage of the power output MOS transistor increases, the energy in the output MOS transistor increases accordingly, which can ultimately cause the self-destruction of the output MOS transistor. To avoid this, it is necessary to reduce the gate voltage of the output MOS transistor to limit the output current. However, merely reducing the output current results in decrease in the obtained output current, impeding the power output MOS transistor from functioning satisfactory.

In order to obtain a maximum output current without destructing the output MOS transistor, it is preferred to increase the current limit value when the drain-source voltage of the output MOS transistor is low, and decrease the current limit value when the voltage is high. Thus, a current limiter that controls a current depending on the drain-source voltage is required.

A ratio of the current flowing through the output MOS transistor 64 and the current detection MOS transistor 65 is constant. However, to be exact, since the source voltage of the current detection MOS transistor 65 increases as the current of the output MOS transistor 64 increases, the drain-source voltage of the current detection MOS transistor 65 becomes smaller with respect to the drain-source voltage of the output MOS transistor 64. Thus, as the drain-source voltage of the output MOS transistor 64 increases, the current flowing through the current detection MOS transistor 65 decreases accordingly, thereby reducing the current flowing into the protection MOS transistor 66.

Figure 8:
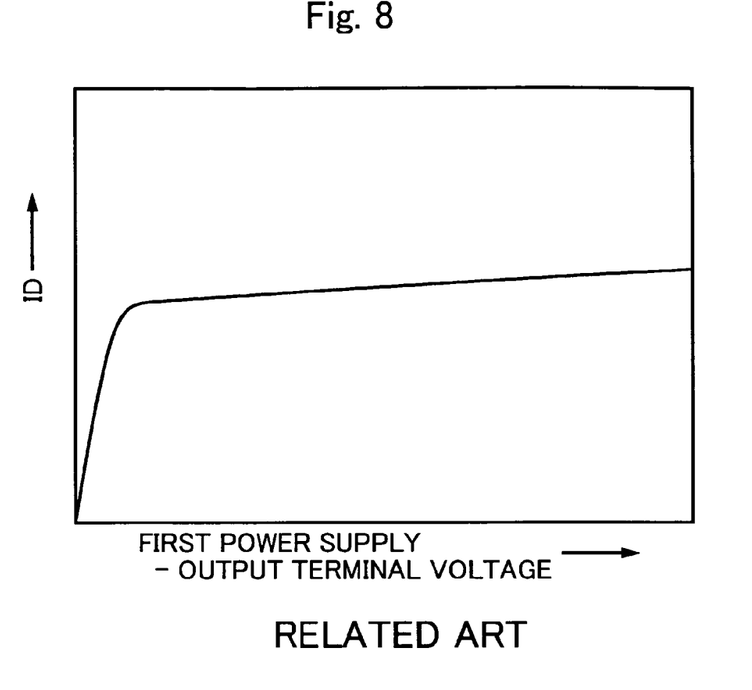
FIG. 8 is a graph showing the current characteristics of an output MOS transistor with respect to the voltage between a first power supply and an output terminal in the current limiters of FIGS. 6 and 7.

This results in increase in the voltage of the input terminal 63, which reduces the current limit value. The current characteristics of the output MOS transistor 64 with respect to the voltage between the first power supply 61 and the output terminal 69 is shown in FIG. 8. As the voltage between the drain and source of the output MOS transistor 64 increases, the energy in the output MOS transistor 64 increases. Thus, a high limiting current causes destruction of the output MOS transistor 64.

Figure 9:
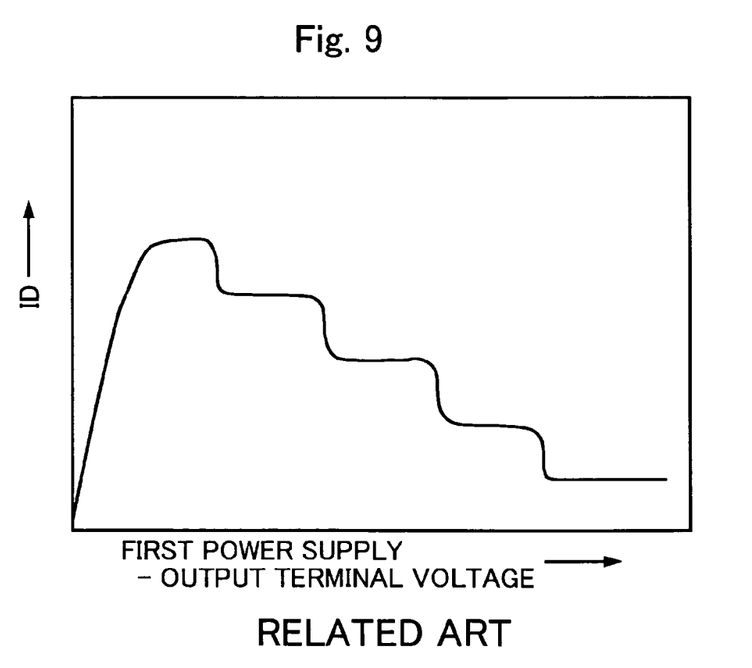
FIG. 9 is a waveform graph of a limiting current with gradual control in a current limiter of a related art.

Hence, it is preferred to reduce the current limit value as the drain-source voltage of the output MOS transistor 64 increases. FIG. 9 shows a limiting current waveform in the case of using gradual control and the like. This technique, however, requires a large size of circuit and fails to obtain a smooth waveform of the limiting current.

SUMMARY OF THE INVENTION

A current limiter of an output transistor of an aspect of the invention is as follows. A current limiter of an output transistor comprises an output transistor, a current detection transistor monitoring a current flowing through the output transistor, a current mirror circuit, a protection transistor outputting a current having passed through the current mirror circuit, the current being proportional to the monitored current and dependent on a voltage between a drain and a source or between a collector and an emitter of the output transistor and an input terminal connected to an output of the protection transistor.

In another aspect, the above current limiter of an output transistor may be as follows. The output transistor is connected in series with a load. A gate or a base of the output transistor is connected to the input terminal. A connection node between the output transistor and the load is connected to an output terminal. A gate or a base, and a drain or a collector of the current detection transistor are each connected to the output transistor. A control element is connected between a source or an emitter of the current detection transistor and the output terminal. A voltage or a current generated in the control element flows through the current mirror circuit into the protection transistor connected between the input terminal and the output terminal of the output transistor.

In another aspect, in the above current limiter, the current mirror circuit may be connected between a first power supply and an output terminal. The drain or collector of the output transistor may be connected to the first power supply, and the source or emitter of the output transistor may be connected to the output terminal.

In another aspect, in the above current limiter, the control element may be a resistor. Alternatively, the control element may be a metal oxide semiconductor transistor whose drain and gate are short-circuited, or a bipolar transistor whose collector and base are short-circuited.

In yet another aspect, the above current limiter of an output transistor may be as follows. A first transistor and a second transistor constitute a current mirror structure. A fourth transistor is connected between a drain or a collector of the second transistor and the output terminal. The fourth transistor and the protection transistor constitute a current mirror structure. A third transistor is connected between a drain or a collector of the first transistor and the output terminal. A voltage of the control element is supplied to a gate or a base of the third transistor.

In still another aspect, the above current limiter of an output transistor may be as follows. A first transistor and a second transistor constitute a current mirror structure. A fourth transistor is connected between a drain or a collector of the second transistor and the output terminal. The fourth transistor and the protection transistor constitute a current mirror structure. A third transistor is connected between a drain or a collector of the first transistor and the output terminal. A voltage between a drain and a source or between a collector and an emitter of the control element is supplied to a gate or a base of the third transistor. The third transistor and the control element constitute a current mirror structure.

The present invention places a current mirror circuit between a current detection circuit and a protection transistor, thereby achieving a maximum output current while preventing thermal destruction of an output MOS transistor.

BRIEF DESCRIPTION OF THE DRAWINGS

The above and other objects, advantages and features of the present invention will be more apparent from the following description taken in conjunction with the accompanying drawings, in which.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
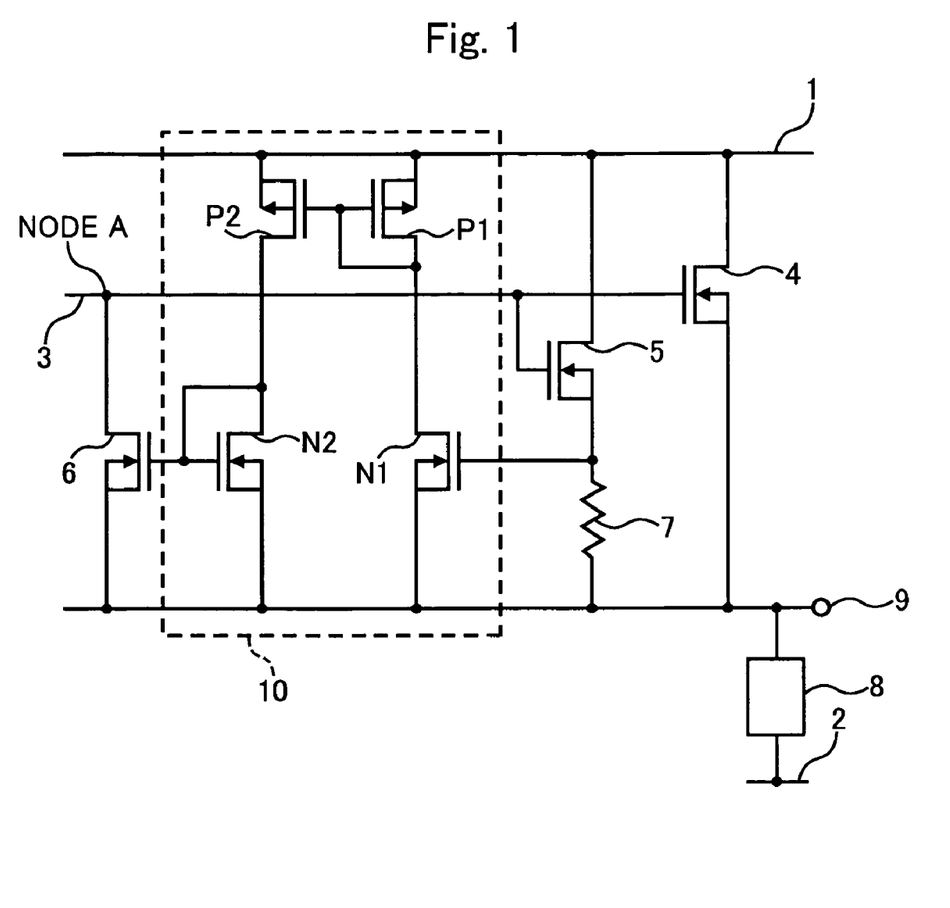
FIG. 1 is a circuit diagram of a current limiter according to an embodiment of the invention.
Figure 2:
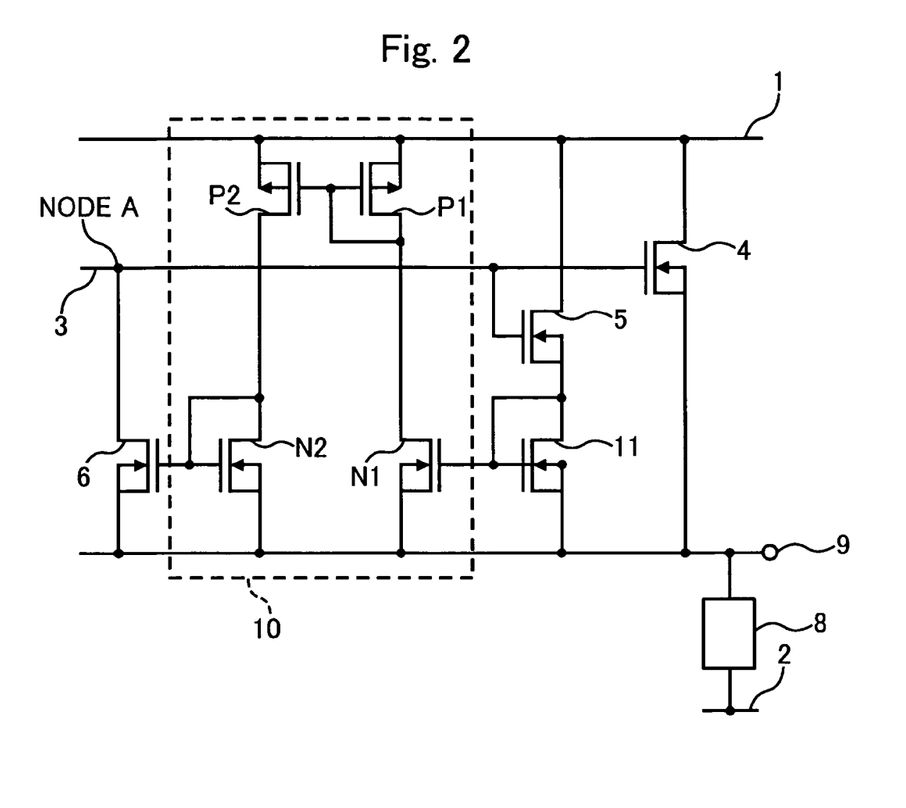
FIG. 2 is a circuit diagram of a current limiter according to another embodiment of the invention.

An embodiment of the invention is explained hereinafter in detail with reference to the drawings. Referring first to FIGS. 1 and 2, the current limiters include an Nch source follower in which an output MOS transistor 4 and a load 8 are connected in series between a first power supply 1 and a second power supply 2. An output terminal 9 is connected to a connection node of the output MOS transistor 4 and the load 8. The output MOS transistor 4 is turned on or off according to a first control signal 3 inputted to the gate terminal. The current limiters also have a current detection MOS transistor 5. A given ratio exists between the current detection MOS transistor 5 and the output MOS transistor 4. With this current ratio, the current detection MOS transistor 5 monitors the current of the output MOS transistor 4. The current limiter of FIG. 1 has a control resistor 7 between the source of the current detection MOS transistor 5 and the output terminal 9. The current limiter of FIG. 2 replaces the control resistor 7 with a control MOS transistor 11 whose drain and source are short-circuited. The current limiters further have a protection MOS transistor 6 connected between the node A and the output terminal 9.

The current limiters include a multistage current mirror 10. MOS transistors P2 and P1 constitute a current mirror structure. A MOS transistor N2 is connected between the drain of the MOS transistor P2 and the output terminal 9. The MOS transistor N2 and the protection MOS transistor 6 constitute a current mirror structure. A MOS transistor N1 is connected between the drain of the MOS transistor P1 and the output terminal 9. In the current limiter of FIG. 1, the gate of the MOS transistor N1 receives the voltage of the control resistor 7. In the current limiter of FIG. 2, the gate of the MOS transistor N1 receives the drain-source voltage of the control MOS transistor 11. In this case, the MOS transistor N1 and the control MOS transistor 11 constitute a current mirror structure.

The circuit structure of this embodiment is explained below. The circuit of this embodiment is different from conventional circuits in that it includes the multistage current mirror circuit 10. The other elements are the same as conventional techniques.

Figure 4:
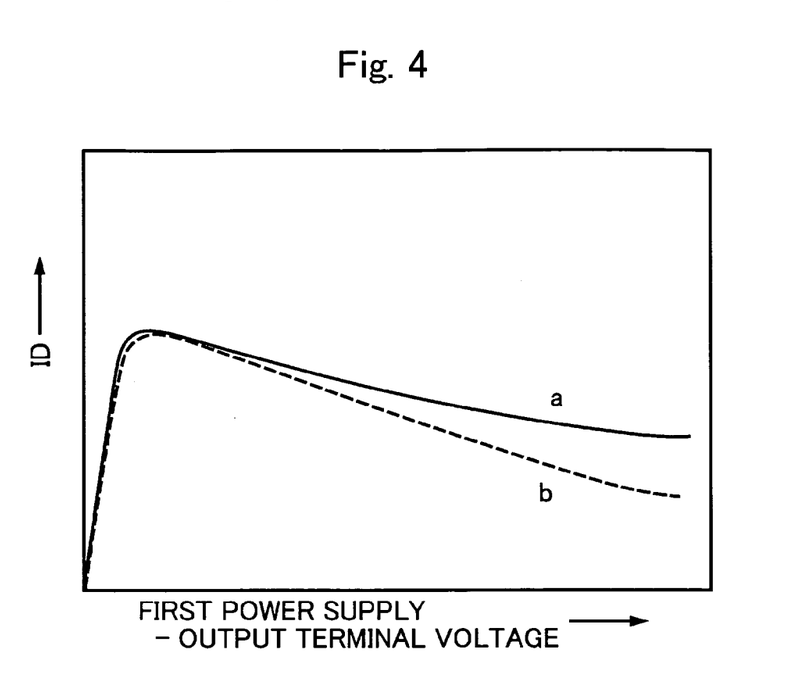
FIG. 4 is a graph showing the current characteristics of an output MOS transistor with respect to a voltage between a first power supply and an output terminal.

The multistage current mirror circuit 10 is as follows. The gate of the MOS transistor N1 receives an output signal from the control resistor 7 or the control MOS transistor 11. The MOS transistors P1 and P2 constitute a current mirror structure. The current through the MOS transistor P2 is supplied to the MOS transistor N2 and the protection MOS transistor 6, which also constitute a current mirror structure. The current through the MOS transistors P1, P2, N1, and N2 increases as the voltage between the first power supply 1 and the output terminal 9, which is, the drain-source voltage of the output MOS transistor 4, increases by the effect of channel length modulation. The current of the protection MOS transistor 6 thereby increases accordingly, which reduces the gate voltage of the output MOS transistor 4. It is thus possible to limit the current through the output MOS transistor 4 so that it has the characteristics as shown in the waveform "a" of FIG. 4.

This shows that the drain current through the protection MOS transistor 6 increases with respect to the drain current through the current detection MOS transistor 5 in accordance with the drain-source voltage of the output MOS transistor 4 by passing through the current mirror circuit. The same effect may be obtained when the current mirror circuit does not have a multistage structure.

Figure 5:
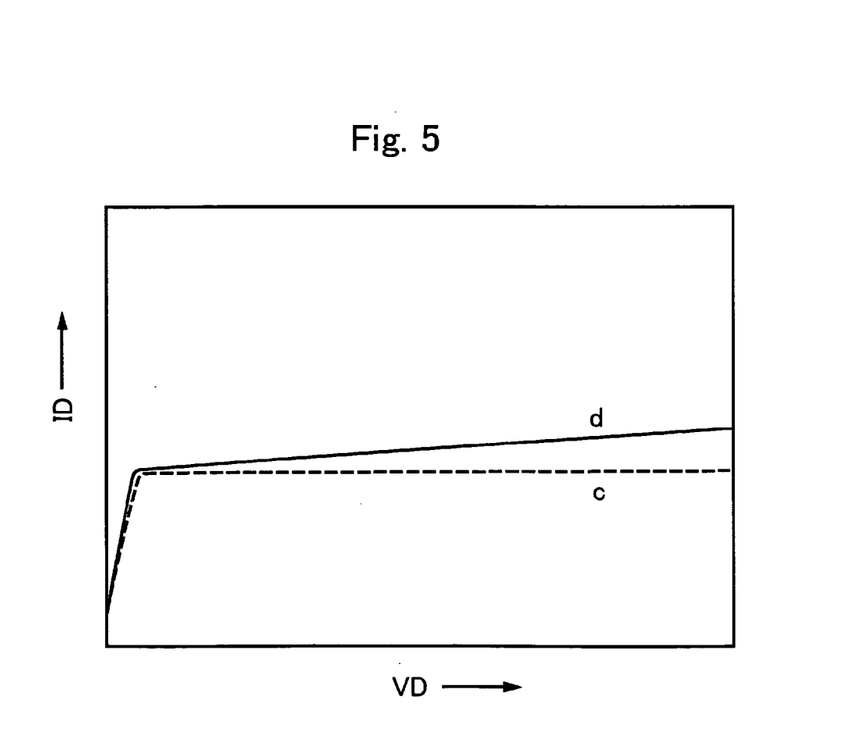
FIG. 5 is a graph showing the VDS-ID characteristics of a MOS transistor.

The waveform "d" of FIG. 5 is the waveform with the channel length modulation. The waveform "c" of FIG. 5 shows the ideal VD-ID characteristics of the MOS transistor. In practice, however, ID increases as VD increases by the channel length modulation as shown in the waveform "d".

Figure 3:
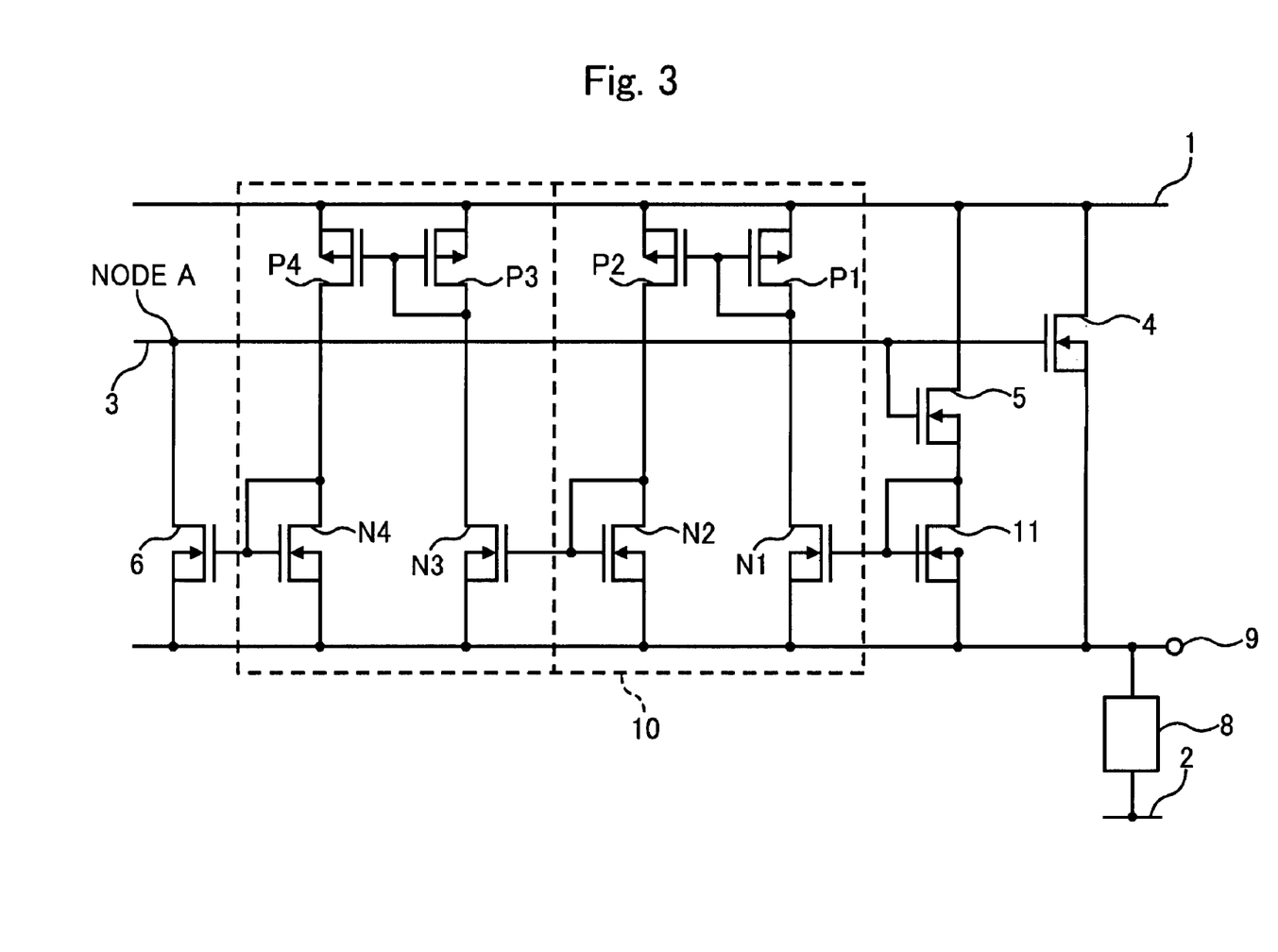
FIG. 3 is a circuit diagram of a current limiter according to still another embodiment of the invention.

Increasing the number of current mirrors as shown in FIG. 3 allows further increase in the dependence on the voltage between the first power supply 1 and the output terminal 9. This further decreases the limit value so that it has the characteristics as shown in the waveform "b" of FIG. 4.

Though the above embodiment explains the case of using the MOS transistors, it is possible to use bipolar transistors instead to form a similar circuit. It is also possible to use both MOS transistors and bipolar transistors.

It is apparent that the present invention is not limited to the above embodiment that may be modified and changed without departing from the scope and spirit of the invention.

What is claimed is:

1. A current limiter of an output transistor, comprising:
   an output transistor connected to an output terminal;
   a current detection transistor monitoring a current flowing through the output transistor;
   a current mirror circuit;
   a protection transistor outputting a current having passed through the current mirror circuit, the current being proportional to the monitored current and dependent on a voltage between a drain and a source or between a collector and an emitter of the output transistor; and
   an input terminal and the output terminal connected to an output of the protection transistor.

2. The current limiter of an output transistor according to claim 1, further comprising:
   a load connected in series with the output transistor, the output terminal connected to a connection node between the output transistor and the load; and
   a control element connected between a source or an emitter of the current detection transistor and the output terminal, and generating a voltage or a current, which flows through the current mirror circuit into the protection transistor connected between the input terminal and the output terminal of the output transistor,
   wherein a gate or a base of the output transistor is connected to the input terminal, and a gate or a base, and a drain or a collector of the current detection transistor are each connected to the gate or the base, and the drain or the collector of the output transistors, respectively.

3. The current limiter of an output transistor according to claim 2, wherein the control element comprises a resistor.

4. The current limiter of an output transistor according to claim 2, wherein the control element comprises one of a metal oxide semiconductor transistor whose drain and gate are short-circuited and a bipolar transistor whose collector and base are short-circuited.

5. The current limiter of an output transistor according to claim 1, wherein the current mirror circuit is connected between a first power supply and the output terminal.

6. The current limiter of an output transistor according to claim 2, wherein the current mirror circuit is connected between a first power supply and the output terminal.

7. The current limiter of an output transistor according to claim 2, comprising:
   a first transistor and a second transistor comprising a current mirror structure;
   a fourth transistor connected between a drain or a collector of the second transistor and the output terminal, the fourth transistor and the protection transistor comprising a current mirror structure; and
   a third transistor connected between a drain or a collector of the first transistor and the output terminal, a gate or a base of the third transistor receiving a voltage of the control element.

8. The current limiter of an output transistor according to claim 2, comprising:
   a first transistor and a second transistor comprising a current mirror structure;
   a fourth transistor connected between a drain or a collector of the second transistor and the output terminal, the fourth transistor and the protection transistor comprising a current mirror structure; and
   a third transistor connected between a drain or a collector of the first transistor and the output terminal, a gate or a base of the third transistor receiving a voltage between a drain and a source or between a collector and an emitter of the control element, the third transistor and the control element comprising a current mirror structure.

9. A current limiter circuit, comprising:
   an output transistor connected to a load;
   a detection transistor monitoring a current of the output transistor;
   a protection transistor provided to reduce a voltage at a gate of the output transistor; and
   a current mirror circuit including an input terminal connected to the detection transistor and an output terminal connected to the protection transistor, wherein a current increases by an effect of channel length modulation.

10. The current limiter of claim 9, wherein the current mirror circuit is activated when the current of the output transistor exceeds a current limit value.

11. The current limiter circuit according to claim 10, wherein the current mirror circuit comprises a plurality of current mirrors as adjusting the current limit value.

12. The current limiter circuit according to claim 9, wherein the current mirror circuit includes a current path between a power source and the output terminal, and the current path is not controlled by a transistor supplied with a start-up signal.

13. A current limiter circuit comprising:
    an output transistor providing a current to a load;
    at least one current mirror circuit connected in parallel with said output transistor such that a voltage drop across said output transistor determines a current in said at least one current mirror circuit;
    means to detect a current flowing through said output transistor; and
    means to control an excessive current through said output transistor in proportion to said voltage drop across said output transistor, as based upon both said voltage drop across said output transistor and said current flowing through said output transistor.

* * * * *